(12) United States Patent
Suda

(10) Patent No.: US 7,239,547 B2
(45) Date of Patent: Jul. 3, 2007

(54) MEMORY DEVICE

(75) Inventor: Takaya Suda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 11/228,290

(22) Filed: Sep. 19, 2005

(65) Prior Publication Data
US 2006/0282717 A1 Dec. 14, 2006

(30) Foreign Application Priority Data
May 30, 2005 (JP) ............... 2005-157522

(51) Int. Cl.
*G11C 16/00* (2006.01)
(52) U.S. Cl. .................. 365/185.09; 365/200
(58) Field of Classification Search ............ 365/185.09
See application file for complete search history.

(56) References Cited

U.S. PATENT DOCUMENTS 5,617,364 A * 4/1997 Hatakeyama ............... 365/200
6,751,123 B2 * 6/2004 Katayama et al. ..... 365/185.09
2004/0240268 A1 * 12/2004 Kim et al. ............. 365/185.09
2006/0107130 A1 * 5/2006 Baker et al. ................. 714/710

FOREIGN PATENT DOCUMENTS

JP 2003-280822 10/2003

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A memory device used attach to a host system includes a nonvolatile memory including a plurality of blocks, each of the blocks being a unit for data erasure and including a plurality of pages, each of the pages including a data section which stores first data supplied from the host system, and a redundancy section which stores at least second data used to manage the first data, a detection circuit which generates a first code used to detect a first error contained in the second data, and detects the first error based on the first code, and a correction circuit which generates a second code used to detect and correct a second error contained in the first data and the second data, and detects and corrects the second error based on the second code.

16 Claims, 6 Drawing Sheets

//MEMORY DEVICE

CROSS-REFERENCE TO RELATED APPLICATIONS

This application is based upon and claims the benefit of priority from prior Japanese Patent Application No. 2005-157522, filed May 30, 2005, the entire contents of which are incorporated herein by reference.

BACKGROUND OF THE INVENTION

1. Field of the Invention

The present invention relates to a memory device with a nonvolatile memory, and more particularly to a memory card with a flash memory.

2. Description of the Related Art

A secure digital (SD™) memory card is known as a memory device using a NAND flash memory. This memory card exchanges data communications with a host system such as a digital camera via, for example, a command line and data line.

NAND flash memories comprise a plurality of blocks. Each block is a minimum erasable unit and consists of a plurality of pages as minimum write units. Further, each page comprises, for example, a data section of 512 bytes and a redundancy section of 16 bytes. Although the redundancy section can be used for various purposes, it is recommended to write an ECC code to the section to avoid data corruption, which can occur in NAND flash memories.

In NAND flash memories, the use of even smaller memory cells and multi-value memory cells is increasing the probability of errors. Because of this, there is a case where a high-capacity ECC circuit is needed, and an ECC code of 10 bytes is written to the redundancy section. In this case, the remaining 6 bytes of the redundancy section is freely usable, and can be used for a logical block address, flag, etc.

In the prior art, the ECC code is created from data in the data section and redundancy section. Therefore, unless all page data is read and computation is performed based on it, error detection and correction cannot be performed. This applies, even if, for example, only a logical block address stored in the redundancy section is necessary.

To acquire 6-byte data from the redundancy section, data of 528 (512+16) bytes must be read. This means that the time required for data reading is 88 (528/6) times that required for reading 6-byte data from the redundancy section.

This being so, the time necessary to read/write data after the memory card is activated increases as the capacity (number of blocks) of the memory card increases.

Concerning a technique related to the above, see, for example, Jpn. Pat. Appln. KOKAI Publication No. 2003-280822, which discloses reducing the time necessary to read/write data from/to a nonvolatile memory.

BRIEF SUMMARY OF THE INVENTION

In accordance with an aspect of the invention, there is provided a memory device used attach to a host system and comprising:

a nonvolatile memory including a plurality of blocks, each of the blocks being a unit for data erasure and including a plurality of pages, each of the pages including a data section which stores first data supplied from the host system, and a redundancy section which stores at least second data used to manage the first data;

a detection circuit which generates a first code used to detect a first error contained in the second data, and detects the first error based on the first code; and a correction circuit which generates a second code used to detect and correct a second error contained in the first data and the second data, and detects and corrects the second error based on the second code.

DETAILED DESCRIPTION OF THE INVENTION

Figure 1:
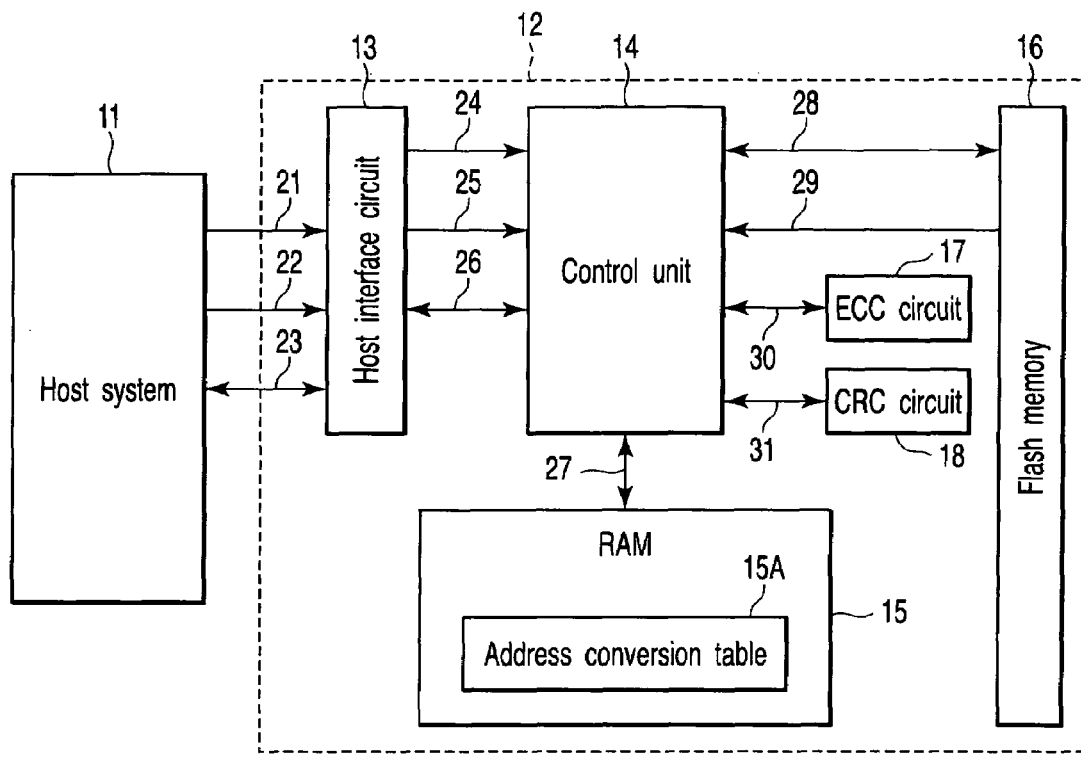
FIG. 1 is a block diagram illustrating a memory card 12 according to a first embodiment of the invention.

Embodiments of the invention will be described with reference to the accompanying drawings. In the description below, like reference numerals denote like elements, and a repeated description will be given only when helpful.

(First Embodiment)

FIG. 1 is a block diagram illustrating a memory card 12 according to a first embodiment of the invention. The memory card 12 is, for instance, an SD™ memory card.

The memory card 12 is used to process various digital contents, such as image data and audio data, and attached in a host system 11, such as a personal computer (PC).

The host system 11 comprises hardware and software for, for example, inputting/outputting data to/from the memory card 12 attached therein.

The memory card 12 comprises a host interface circuit 13, control unit 14, temporary storage circuit (RAM: random access memory) 15, flash memory 16, error correction code (ECC) circuit 17 and cyclic redundancy check (CRC) circuit 18.

The host interface circuit 13 transmits and receives commands, addresses, data, etc. to and from the host system 11 in accordance with a predetermined protocol.

The flash memory 16 is a nonvolatile semiconductor memory, and is specifically a NAND flash memory, for example. The flash memory 16 comprises a plurality of NAND EEPROM cells. Each cell may be a binary memory cell for storing 1-bit data, or a multi-value memory cell for storing data of higher than 1 bit (e.g., 2 bits).

Further, the flash memory 16 includes pages as minimum write units, each page having a storage capacity of, for example, 512 bytes. A unit formed of a certain number of pages (e.g., 32 pages, 256 pages, 512 pages, etc.) is defined as a block.

A page is a writable minimum unit, and a block is an erasable minimum unit. In NAND flash memory, data cannot be rewritten in units of pages, and must be written after the data of the entire block is erased. Therefore, when new data is written to a to-be-rewritten page in a certain block, it is necessary to prepare a data-erased block and to copy thereto the to-be-rewritten page and data in the certain block that should not be erased. Namely, it is necessary to copy data in a block to another block.

Because of this control, each block is not uniquely specified by a logical block address corresponding thereto and issued from a host system. Note that a logical block address means a block address issued and managed by a host system. Actual block addresses assigned to the flash memory 16 are called physical block addresses.

Thus, logical block addresses do not correspond to physical block addresses. To determine a block to actually access, a logical block address is converted into the corresponding physical block address using an address conversion table 15A, and the corresponding physical block address is used to determine the block.

In addition, when data in a block is rewritten, data rewriting is performed in another block. Therefore, the correspondence between a logical block address and the corresponding physical block address is dynamically changed whenever data is rewritten. Accordingly, whenever data is rewritten, the correspondence between portions in the address conversion table 15A, which are related to the rewriting, is updated.

Figure 2:
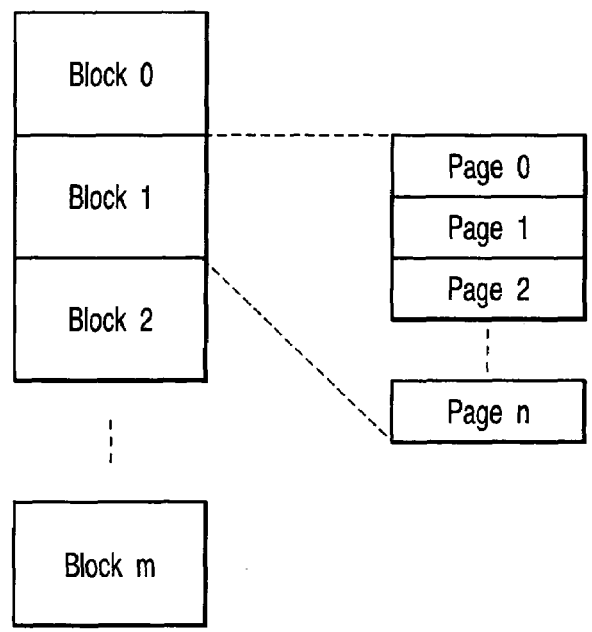
FIG. 2 is a schematic view illustrating a memory cell array included in the flash memory 16 appearing in FIG. 1.

FIG. 2 is a schematic view illustrating a memory cell array included in the flash memory 16. The flash memory 16 has a plurality of blocks 0 to m. Each block is formed of a plurality of pages 0 to n.

Figure 3:
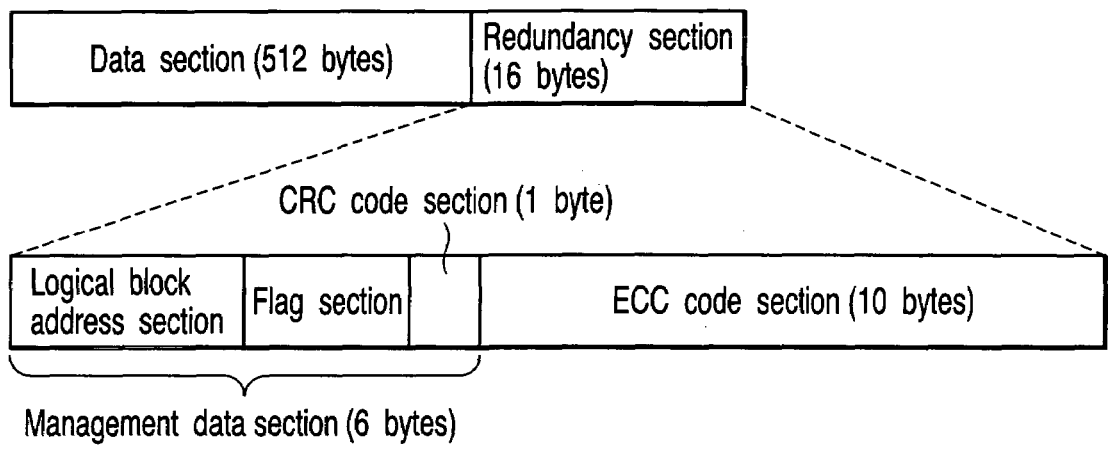
FIG. 3 is a schematic view illustrating the structure of each page appearing in FIG. 2.

FIG. 3 is a schematic view illustrating the structure of each page. Each page comprises, for example, a data section (of, for example, 512 bytes) for storing data, and a redundancy section (of, for example, 16 bytes). The redundancy section is formed of a management data section (of, for example, 6 bytes) for storing management data used to manage data input by the host system 11, and an ECC code section (of, for example, 10 bytes) for storing the ECC code generated by the ECC circuit 17.

The management data section is formed of a logical block address section, flag section and CRC code section. The logical address section stores logical block addresses. The flag section stores, for instance, a flag used to determine, for instance, the type of data stored in the data section. The CRC code section (of e.g., 1 byte) stores the CRC code generated by the CRC circuit 18 with respect to management data (logical block address and flag).

As described above, the flash memory 16 is a device in which data reading/writing is performed in units of pages, and data erasure is performed in units of blocks. Each page is formed of the data section of 512 bytes, and the redundancy section of 16 bytes. Namely, when seen from the host system 11 side, each page appears to be of 512 bytes.

The control unit 14 controls various circuits to enable data input by the host system 11 to be written to the flash memory 16, and to enable data read from the flash memory 16 to be output to the host system 11. Further, the control unit 14 generates management data for data input by the host system 11. The management data is written to the management data section of the flash memory 16. The operation of the control unit 14 will be described later.

The RAM 15 is a work memory for the control unit 14. Part of the work memory is used as a data buffer for temporarily storing data transmitted between the control unit 14 and the flash memory 16. The RAM 15 further stores the address conversion table 15A generated by the control unit 14. The control unit 14 controls transmission of data between the memory card 12 and the host system 11, using the address conversion table 15A.

The ECC circuit 17 generates an ECC code necessary for error detection/correction of data input by the host system 11 and management data generated by the control unit 14. The ECC code is written to the flash memory 16, along with the data and management data. Further, the ECC circuit 17 performs error detection/correction of data and management data read from the flash memory 16, based on the ECC code.

The CRC circuit 18 generates a CRC code necessary for detecting an error in management data generated by the control unit 14. The CRC code is written to the flash memory 16 along with the management data. Further, the CRC circuit 18 performs error detection concerning management data read from the flash memory 16, based on the CRC code.

The sizes of the ECC code and CRC code are determined by the error detection/correction scheme employed. In the embodiment, CRC 7 is employed as an example of the error detection scheme used by the CRC circuit 18. CRC 7 is a scheme for generating a CRC code of 7 bits from data. Accordingly, the CRC code section storing the CRC code requires a storage capacity of 1 byte.

Figure 4:
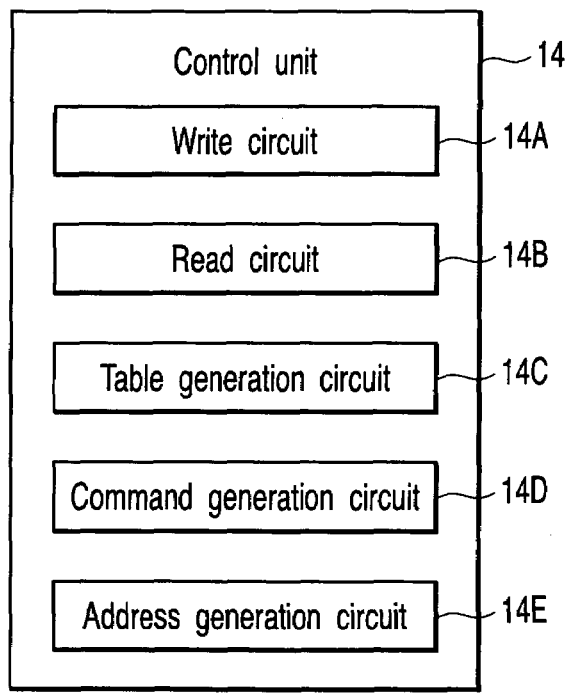
FIG. 4 is a block diagram illustrating the structure of the control unit 14 appearing in FIG. 1.

FIG. 4 is a block diagram illustrating the control unit 14. The control unit 14 comprises a write circuit 14A, read circuit 14B, table generation circuit 14C, command generation circuit 14D and address generation circuit 14E.

The write circuit 14A writes data input by the host system 11 and management data to each page of the flash memory 16. Specifically, the write circuit 14A controls a write enable terminal of the flash memory 16 to write data to the flash memory 16.

The read circuit 14B reads management data (i.e., a logical block address, flag and CRC code) from the management data section of each page. The read circuit 14B further reads data from each page. Specifically, the read circuit 14B controls a read enable terminal of the flash memory 16 to read data therefrom.

The table generation circuit 14C generates an address conversion table 15A based on the logical block address read from the flash memory 16, and temporarily stores the address conversion table 15A in the RAM 15.

The command generation circuit 14D generates a command for controlling the flash memory 16. Namely, the command generation circuit 14D generates, for example, a read command for reading data from the flash memory 16, and a write command for writing data to the flash memory 16. The command generated by the command generation circuit 14D is sent to the flash memory 16 via a data line 28.

The address generation circuit 14E generates an address to be sent to the flash memory 16, using an address from the host system 11 and the address conversion table 15A. The address generated by the address generation circuit 14E is sent to the flash memory 16 via the data line 28.

The host system 11 supplies a command, address and data to the memory card 12. The command input by the host system 11 is sent to the host interface circuit 13 via a command line 21. The host interface circuit 13 interprets the command. The interpreted command information is sent to the control unit 14 via a command line 24.

An address input by the host system 11 is sent to the host interface circuit 13 via an address line 22. The address is then sent to the control unit 14 via an address line 25.

Data input by the host system 11 is sent to the host interface circuit 13 via a data line 23. The data is then sent to the control unit 14 via a data line 26. The control unit 14 writes data to the flash memory 16 via the data line 28.

Data read from the flash memory 16 is sent to the control unit 14 via the data line 28. The data is then sent to the host interface circuit 13 via the data line 26. The host interface circuit 13 outputs the data to the host system 11 via the data line 23.

The control unit 14 transmits/receives data to/from the RAM 15 via a data line 27, transmits/receives data to/from the ECC circuit 17 via a data line 30, and transmits/receives data to/from the CRC circuit 18 via a data line 31.

The control unit 14 is also connected to the flash memory 16 via a signal line 29. The flash memory 16 sends a busy signal to the control unit 14 via the signal line 29. The busy signal indicates that the flash memory 16 is in a ready state or busy state.

To read data from the flash memory 16, the control unit 14 issues a read command thereto, and waits for the time when the flash memory 16 shifts to the ready state (when the busy signal shifts to high level). Namely, only when the flash memory 16 is in the ready state, the control unit 14 can read data therefrom. Similarly, to write data to the flash memory 16, the control unit 14 issues a write command thereto, and waits for the time when the flash memory 16 shifts to the ready state. Namely, only when the flash memory 16 is in the ready state, the control unit 14 can write data thereto.

Figure 5:
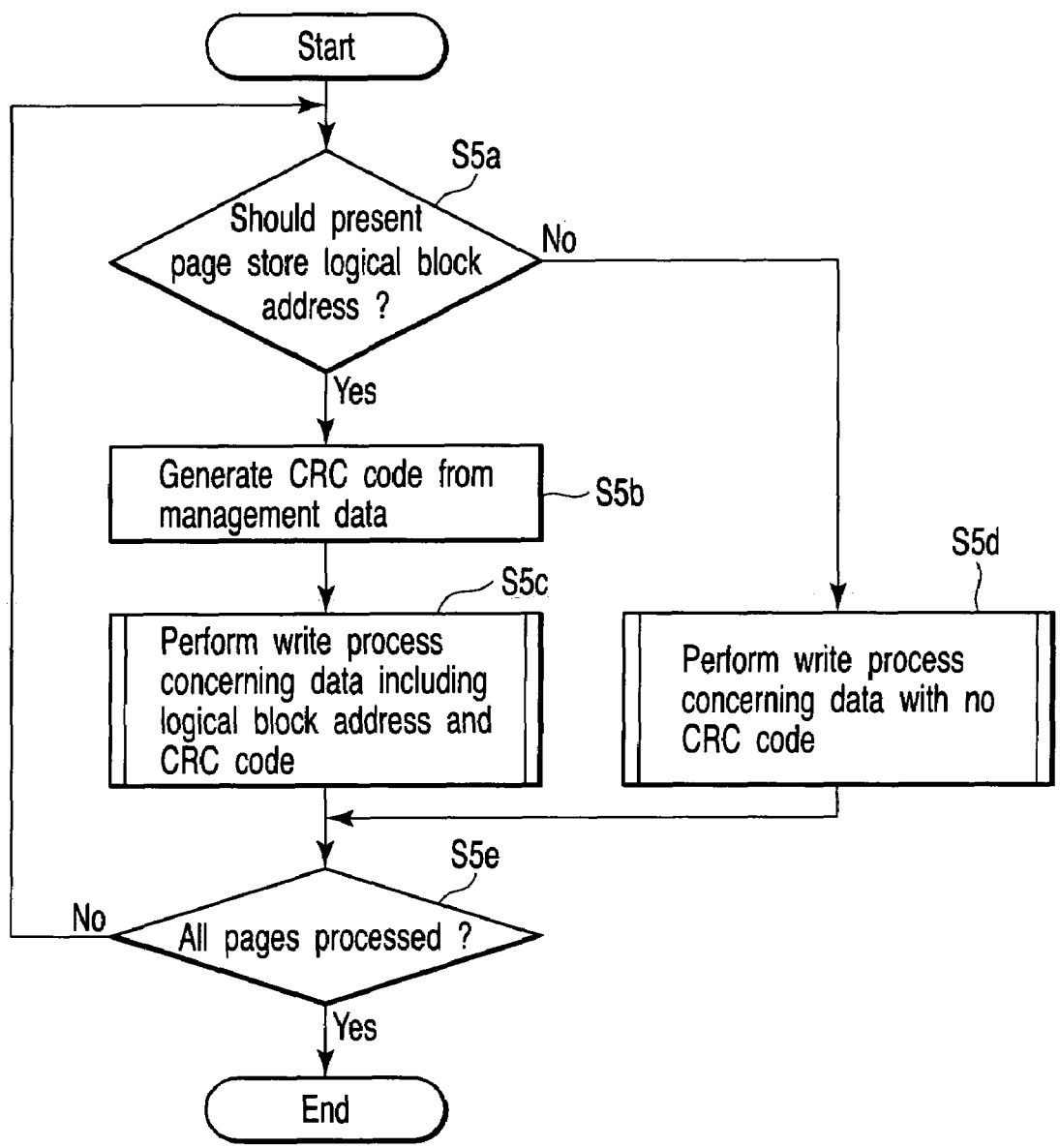
FIG. 5 is a flowchart illustrating the operation of writing data into the flash memory 16 appearing in FIG. 1.

The operation of the memory card 12 constructed as the above will now be described. A description will firstly be given of the operation of writing data to the flash memory 16. FIG. 5 is a flowchart illustrating the data writing operation.

At first, the write circuit 14A determines whether the page, to which data is written, stores a logical block address (step S5a). In the embodiment, assume that a logical block address is written only on, for example, page 0.

The parameter necessary for initialization of the memory card 12 is information (i.e., the logical block address) that indicates the logical block storing the data to be written to a physical block. Therefore, it is not necessary to store the parameter in all pages. It is sufficient if at least one page stores the logical block address. Assuming that page 0 cannot be corrected, the logical block address may be written to the first several pages.

In general, the CRC circuit 18 requires a clock cycle corresponding to the length of data to generate a CRC code from the data. If CRC codes are generated from the redundancy sections of all pages in a block, more processing time and power consumption than necessary are required.

If one byte included in the management data section of 6 bytes is used as an error detection code (CRC code), and a CRC code is generated from the remaining 5 bytes, at least 40 clocks (5 bytes×8=40 bits) are required. When the memory card 12 operates at 10 MHz, the clock cycle is 100 nsec. Accordingly, 4 μsec is required to generate a CRC code.

In light of the above, in the data writing operation of the embodiment, it is determined whether the present page should store a parameter necessary for initialization, and a CRC code is generated only when data is written to a page that should store the parameter necessary for initialization. As a result, the time required to write data to each block can be shortened.

If it is determined at step S5a that the present page should store the logical block address, the CRC circuit 18 generates a CRC code from the management data (the logical block address and flag) (step S5b). Alternatively, the CRC circuit 18 may generate a CRC code only from the logical block address.

Subsequently, the write circuit 14A performs a write process concerning data of 528 bytes including the logical block address and CRC code (step S5c). This process includes generation of an ECC code by the ECC circuit 17, and writing of the ECC code.

In contrast, if it is determined at step S5a that the present page should not store the logical block address, the CRC circuit 18 does not generate a CRC code. In this case, the write circuit 14A executes a write process concerning data of 528 bytes including no CRC code (step S5d). This process includes generation of an ECC code by the ECC circuit 17, and writing of the ECC code.

The write circuit 14A and CRC circuit 18 iterate the above-described control until data is written to all pages of each block (step S5e). Thus, the logical block address and CRC code are written to the redundancy section of a predetermined page.

Initialization of the memory card 12 will be described. Initialization means an operation performed during the activation (or turn-on) of the memory card 12 for generating the address conversion table 15A showing the correspondence between logical block addresses and physical block addresses. Namely, during activation, the memory card 12 reads a logical block address from page 0 of each block. Using the acquired logical block addresses, the memory card 12 (more specifically, the table generation circuit 14C of the memory card 12) generates the address conversion table 15A.

Figure 6:
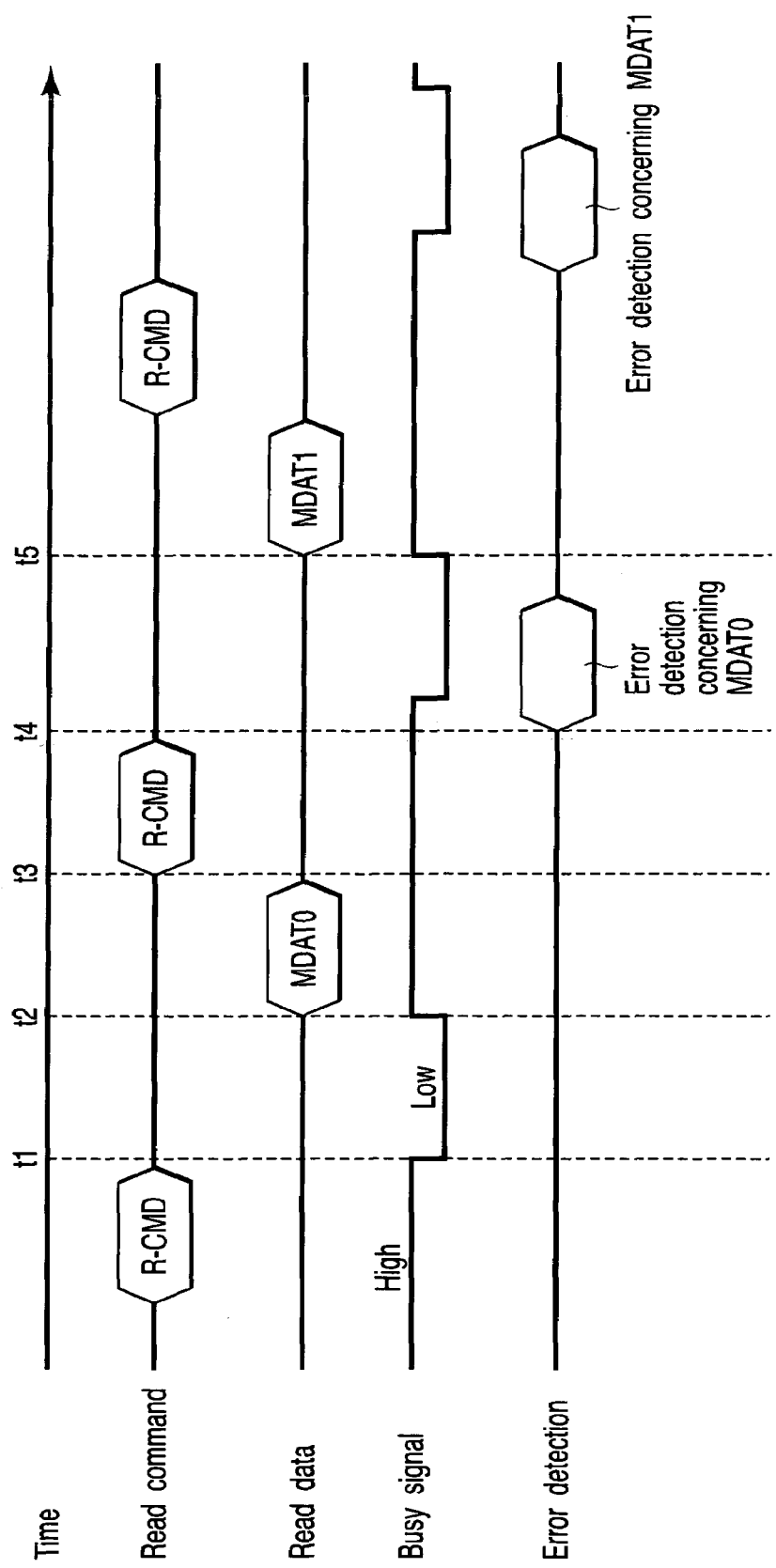
FIG. 6 is a timing chart illustrating the operation of computing a CRC code.

Computation of a CRC code will now be described. In the embodiment, computation of a CRC code is performed when the flash memory 16 is in the busy state. FIG. 6 is a timing chart illustrating the computation process.

Firstly, the command generation circuit 14D issues a read command (R-CMD) to read management data from page 0 of block 0 in the flash memory 16. Upon receiving the command, the flash memory 16 supplies the control unit 14 with a busy signal of low level that indicates that the memory 16 is in the busy state.

The period in which the busy signal is at low level is a preparation period in which data can be output from memory cells in the flash memory 16 to an external interface circuit (not shown) incorporated in the flash memory 16. Further, the busy signal is generated by a controller (not shown) incorporated in the flash memory 16.

When data output has been prepared, the flash memory 16 is released from the busy state (i.e., it outputs a busy signal of high level). Upon receiving this signal, the control unit 14 (more specifically, the read circuit 14B of the control unit 14) controls the read enable terminal of the flash memory 16 to read MDAT0 (management data and a CRC code) from page 0 of block 0 in the flash memory 16.

Subsequently, the control unit 14 issues a read command (R-CMD) to read MDAT1 (management data and a CRC code) from page 0 of block 1 in the flash memory 16. Upon receiving this command, the flash memory 16 supplies the control unit 14 with a busy signal of low level that indicates that the memory 16 is in the busy state. While the flash memory 16 is in the busy state, the control unit 14 performs a computation based on the CRC code contained in the read MDAT0 (i.e., performs an error detection process). The same process is performed for the other blocks.

In the case of currently available flash memories, the period ranging from the start of the busy state to the end is about several tens microseconds. Further, for computation of the CRC code (i.e., error detection), at least 40 clocks are required. Assuming that the memory card 12 operates at 10 MHz, 4 μsec is required for computation of the CRC code.

When error detection is performed immediately after data is read from the flash memory 16, 4 μsec for error detection is added to the time required for reading each data item. This means that the rate of reading is reduced.

However, in the embodiment, error detection by the CRC circuit 18 is performed when the flash memory 16 is in the busy state, as shown in FIG. 6, with the result that the logical block addresses can be read at high speed.

Figure 7:
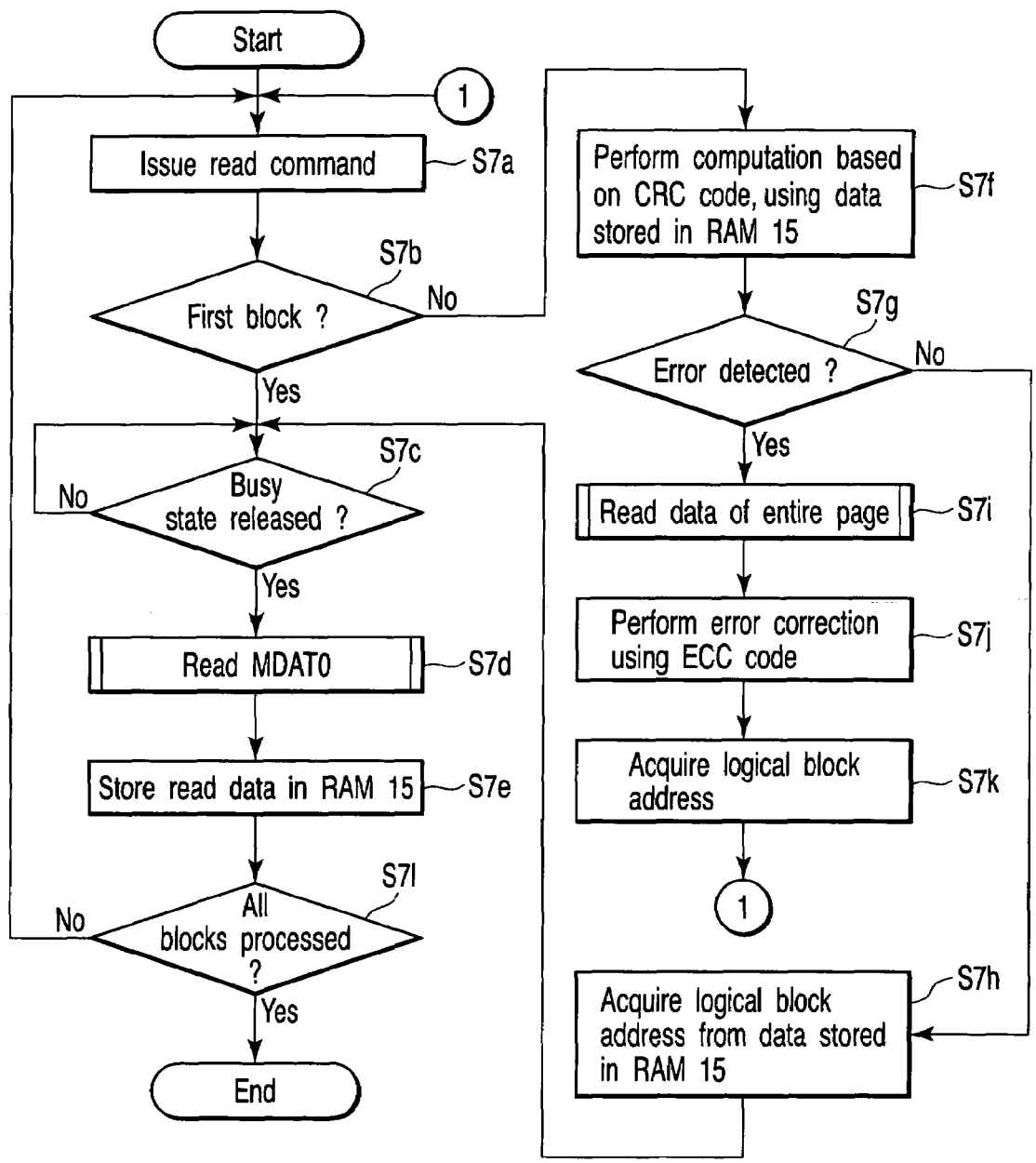
FIG. 7 is a flowchart illustrating the operation of reading a logical block address during initialization of the memory card 12 appearing in FIG. 1.

FIG. 7 is a flowchart illustrating the operation of reading a logical block address during initialization of the memory card 12. Note that no description is given of address control for reading data.

Firstly, the command generation circuit 14D issues a read command to the flash memory 16 (step S7a). Upon receiving this command, the flash memory 16 outputs a busy signal of low level indicating a busy state.

Subsequently, the read circuit 14B determines whether the block from which data is read is the first one (in the embodiment, block 0) (step S7b). If it determines at step S7b that the block is the first one, no CRC code used for computation exists. Accordingly, the read circuit 14B monitors release of the busy state (step S7c).

When the busy state is released, the read circuit 14B reads MDAT0 (management data and a CRC code) from page 0 of block 0 (step S7d), and temporarily stores the read MDAT0 in the RAM 15 (step S7e).

In contrast, if it is determined at step S7b that the block is not the first one, the memory card 12 executes error detection. Specifically, the CRC circuit 18 performs a computation based on the CRC code contained in the data (MDAT0) temporarily stored in the RAM 15 (step S7f), thereby determining whether the management data (i.e., the logical block address and flag) contains an error (step S7g). Note that when the CRC circuit 18 has generated the CRC code only from the logical block address as described above, it determines whether the logical block address contains an error.

If no error is detected at step S7g, the read circuit 14B acquires the logical block address from the data (MDAT0) temporarily stored in the RAM 15 (step S7h). After that, the read circuit 14B returns to step S7c and monitors release of the busy state.

In contrast, if an error is detected at step S7g, the control unit 14 reads all data (the data of the data section, logical block address, flag, CRC code and ECC code) from the entire page (step S7i). Specifically, the command generation circuit 14D issues a read command (R-CMD) to read page data from the flash memory 16. Upon receiving this command, the flash memory 16 supplies the control unit 14 with a busy signal of low level indicating a busy state. After preparation of data output is finished, the flash memory 16 releases the busy state (i.e., outputs a busy signal of high level). Then, the read circuit 14B controls the read enable terminal of the flash memory 16 to read page data from the flash memory 16.

At step S7j, the ECC circuit 17 performs error correction on the page data, using the ECC code. At the next step S7k, the read circuit 14B acquires a logical block address from the corrected data. At this time, the program returns to step S7a, where the command generation circuit 14D issues a read command to read management data and a CRC code from page 0 of the next block.

The read circuit 14B, CRC circuit 18 and ECC circuit 16 iterate the above-described control concerning all blocks (step S7l). As a result, logical block addresses stored in all blocks are acquired.

After that, the table generation circuit 14C generates an address conversion table 15A based on the logical block addresses read from the flash memory 16, and the physical block addresses from which data is read. Using the address conversion table 15A, the memory card 12 can specify a physical block address corresponding to a logical block address issued from the host system 11.

For instance, unless a computation based on a CRC code is performed during a busy state, when a 2 GB memory card is initialized using a NAND flash memory with a block size of 128 kB, extra time of 65 msec (=4 μsec×16384) is required for the computation based on the CRC code, since the number of blocks is 16384.

In the embodiment, this extra time can be eliminated by performing CRC code computation during a busy state, thereby realizing efficient initialization.

As described above in detail, in the embodiment, a logical block address can be acquired by reading only data (management data and a CRC code) stored in the management data section that is included in page data. Namely, high-speed initialization can be realized.

Further, since it is not necessary to store the address conversion table 15A in the flash memory 16, the memory capacity of the flash memory 16 can be increased.

Also, error detection by the CRC circuit 18 is performed when the flash memory 16 is in a busy state. As a result, the time required for reading a logical block address can be reduced by the time required for the error detection.

The CRC circuit 18 may be formed of an ECC circuit. In other words, error detection and correction may be performed on a read logical block address. In this case, when an error is detected, the ECC circuit performs error correction on management data stored in the management data section. Accordingly, when an error has occurred in a logical block address, initialization can be performed more quickly than in the case of performing error correction on the entire page.

(Second Embodiment)

In a second embodiment, when a logical block address contains an error, only the logical block address is corrected.

Figure 8:
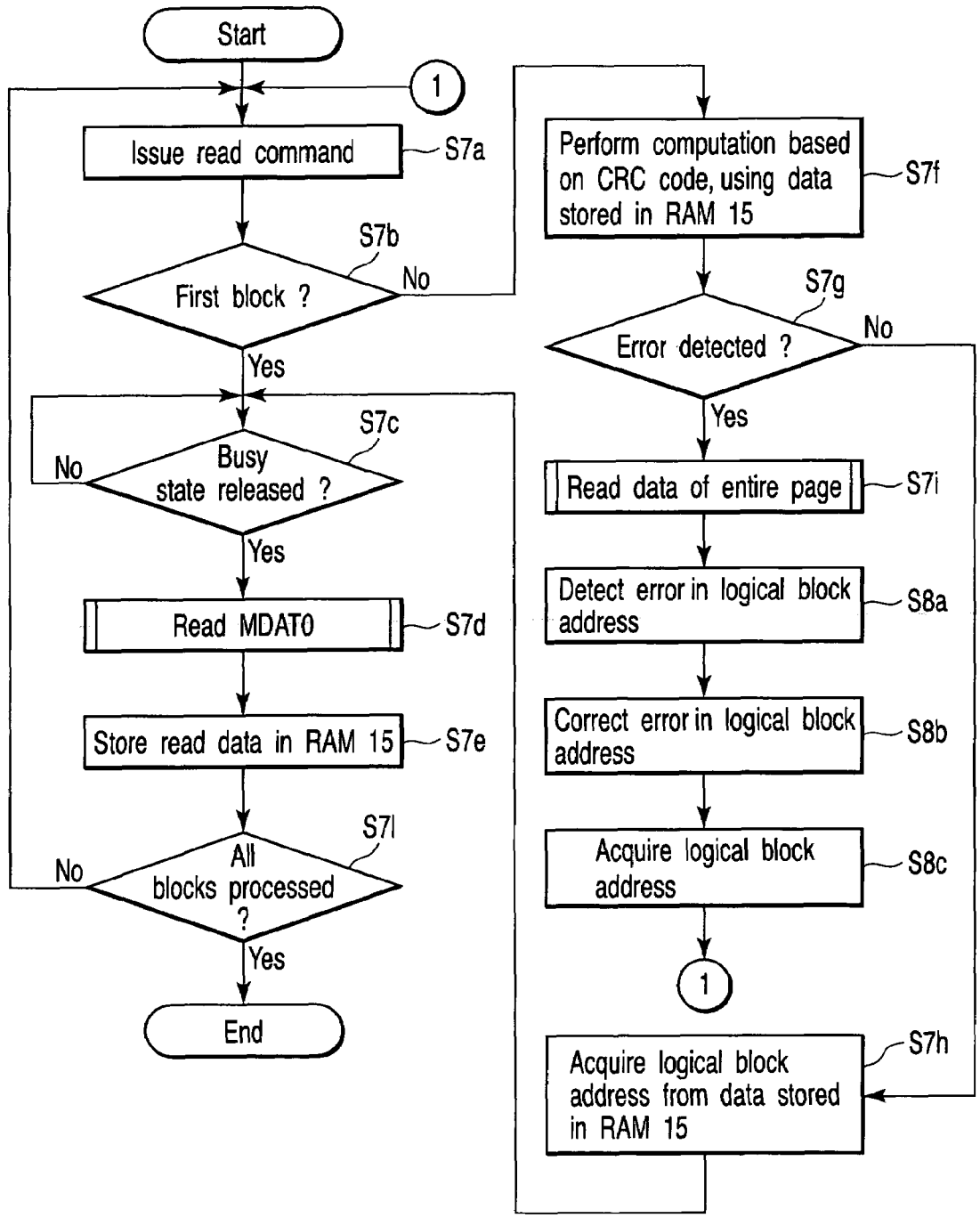
FIG. 8 is a flowchart illustrating the operation of reading a logical block address during initialization of a memory card 12 according to a second embodiment of the invention.

FIG. 8 is a flowchart illustrating the operation of reading a logical block address during initialization of a memory card 12 according to the second embodiment of the invention. In FIG. 8, reference step numbers corresponding to those of FIG. 7 denote similar steps. A description will be given only of the steps different from those of FIG. 7.

After the entire page data is read at step S7i, the ECC circuit 17 detects only an error contained in a logical block address stored in the logical block address section, using an ECC code (step S8a). Subsequently, the ECC circuit 17 corrects only the error (step S8b). At step S8c, the read circuit 14B acquires the corrected logical block address. The process is returned to step S7a, where the command generation circuit 14D issues a read command to read management data and CRC code data from page 0 of the next block.

As described above, in the second embodiment, when the CRC circuit 18 has detected an error in a logical block address, the ECC circuit 17 corrects only the error contained in the logical block address.

Accordingly, the second embodiment can shorten the time required for the ECC circuit 17 to correct an error, thereby realizing high-speed initialization.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory device used attach to a host system, comprising:
    a nonvolatile memory including a plurality of blocks, each of the blocks being a unit for data erasure and including a plurality of pages, each of the pages including a data section which stores first data supplied from the host system, and a redundancy section which stores at least second data used to manage the first data;
    a detection circuit which generates a first code used to detect a first error contained in the second data, and detects the first error based on the first code; and
    a correction circuit which generates a second code used to detect and correct a second error contained in the first data and the second data, and detects and corrects the second error based on the second code.

2. The memory device according to claim 1, wherein the redundancy section includes a first redundancy section which stores the second data and the first code, and a second redundancy section which stores the second code.

3. The memory device according to claim 2, further comprising a write circuit which writes the second data and the first code to the first redundancy section.

4. The memory device according to claim 3, wherein the write circuit writes the second data and the first code to a first page included in the plurality of pages.

5. The memory device according to claim 4, wherein the first redundancy section is provided in the first page.

6. The memory device according to claim 1, further comprising a read circuit which reads the second data from the first redundancy section, and wherein the detection circuit detects the first error from the second data read by the read circuit based on the first code.

7. The memory device according to claim 6, wherein:
    the read circuit reads the first data and the second data when the first error has detected in the second data; and
    the correction circuit detects and corrects the second error contained in the first data and the second data read by the read circuit based on the second code.

8. The memory device according to claim 7, wherein the second data includes a logical block address managed by the host system.

9. The memory device according to claim 8, wherein the detection circuit generates the first code used to detect the first error contained in the logical block address, and detects the first error based on the first code.

10. The memory device according to claim 9, wherein:
    the read circuit reads the first data and the second data when the first error has detected in the logical block address; and
    the correction circuit detects and corrects the second error contained in the logical block address included in the first data and the second data read by the read circuit based on the second code.

11. The memory device according to claim 9, further comprising a generation circuit which generates a table showing correspondence between the logical block address and a physical block address.

12. The memory device according to claim 11, further comprising a memory circuit which stores the table.

13. The memory device according to claim 1, wherein:
    the nonvolatile memory outputs a busy signal indicating a busy state; and
    the detection circuit detects the first error when the nonvolatile memory is in the busy state.

14. The memory device according to claim 13, further comprising a command generation circuit which generates a read command used to read data from the nonvolatile memory, and wherein the nonvolatile memory outputs the busy signal during a period ranging from reception of the read command to completion of preparation of data output.

15. The memory device according to claim 1, wherein the detection circuit is formed of a correction circuit which generates the first code used to detect and correct the first error in the second data, and detects and corrects the first error based on the first code.

16. The memory device according to claim 1, wherein the nonvolatile memory is a NAND flash memory.

* * * * *